United States Patent
Fujita

(10) Patent No.: US 7,900,896 B2
(45) Date of Patent: Mar. 8, 2011

(54) SPECIMEN STAGE

(75) Inventor: Masashi Fujita, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/393,037

(22) Filed: Feb. 26, 2009

(65) Prior Publication Data

US 2009/0218510 A1  Sep. 3, 2009

(30) Foreign Application Priority Data

Feb. 28, 2008  (JP) ................................. 2008-047031

(51) Int. Cl.
B23Q 1/25 (2006.01)
B23Q 1/62 (2006.01)
(52) U.S. Cl. ............. 269/58; 269/60; 269/289 R; 269/63
(58) Field of Classification Search .................... 269/58, 269/59, 60, 289 R, 291, 71, 63
See application file for complete search history.

(56) References Cited

U.S. PATENT DOCUMENTS

| 3,578,233 | A | * | 5/1971 | Meister et al. | ................. 228/5.1 |
| 4,013,280 | A | * | 3/1977 | Chitayat et al. | ................. 269/60 |
| 4,706,796 | A | * | 11/1987 | Chambers | ................. 198/346.1 |
| 2009/0014932 | A1 | * | 1/2009 | Nikaido et al. | ................. 269/55 |
| 2009/0218510 | A1 | * | 9/2009 | Fujita | ......................... 250/443.1 |

FOREIGN PATENT DOCUMENTS

| JP | 2006-237069 A | 9/2006 |
| JP | 2007-019279 A | 1/2007 |
| JP | 2007-042514 A | 2/2007 |

* cited by examiner

Primary Examiner — Lee D Wilson
(74) Attorney, Agent, or Firm — Miles & Stockbridge P.C.

(57) ABSTRACT

An object of the present invention is to provide a specimen stage which is simple in structure, and which suppresses a positional shift due to a friction heat caused by a brake or the like. One aspect to achieve the object provides a specimen stage including: a thrust portion thrust by a thrusting member; and a slide surface thrust by the thrust portion. When the specimen stage stops, the specimen stage performs a control in a way that a part of the slide surface in contact with the thrust portion, and/or a portion adjacent to the part or the thrust portion is heated. By heating the part of the slide surface or the like in this manner, a temperature gradient can be suppressed as described above (see FIG. 3).

7 Claims, 6 Drawing Sheets

SPECIMEN STAGE

BACKGROUND OF THE INVENTION

1. Field of the Invention

The present invention relates to a specimen stage, and particularly relates to a stage-positioning mechanism used in a charged particle beam apparatus such as an electron microscope for measurement, inspection or observation in the field of semiconductor device fabrication.

2. Background Art

A large number of specimen stages in electron microscope units for semiconductor inspection include a stop mechanism to obtain a static image after the positioning is completed. One form of such a stop mechanism in a stage utilizes friction as in the case of a constant friction brake. Another stop mechanism utilizes an ultrasonic motor which serves as both the stop mechanism and a driving mechanism The constant friction brake and the ultrasonic motor needs a surface member to generate a friction force, and these stop mechanisms generate heat. Particularly in a vacuum environment where the thermal conductivity is low, the friction heat causes a temperature gradient in the surface member. The temperature gradient causes the heat to flow in the surface member. A position where the temperature is high in the surface member is taken as a reference position (hereinafter referred to as a thermal-deformation reference position) where thermal expansion and thermal contraction after the thermal expansion occur. At the time of observation with the electron microscope, these thermal expansion and thermal contraction cause the stage to move, and thereby an image of a measured object is observed to be drifting. Particularly, the larger the distance is between the stop position of the stage and the heat generation reference position, the larger the amounts of thermal expansion and thermal contraction of the surface member are.

As a technique to avoid the stage movement due to these thermal expansion and thermal contraction, Patent Document 1 discloses a so-called servo control technique in which the position of a stage is monitored in real time and then a feedback is performed on a deflection amount of electron beam and a motor while following the behavior of a table.

Moreover, Patent Document 2 proposes an approach in which the temperature of a whole stage is controlled and thus maintained at a certain point, thereby reducing a thermal expansion amount and a thermal contraction amount. Furthermore, Patent Document 3 discloses a technique which attempts to minimize a heat generation amount by adopting an active brake to reduce a friction heat.

Patent Document 1: Japanese Patent Application Publication No. 2007-042514

Patent Document 2: Japanese Patent Application Publication No. 2007-019279

Patent Document 3: Japanese Patent Application Publication No. 2006-237069

SUMMARY OF THE INVENTION

The servo control as described in Patent Document 1 needs: a table-position detector having a high resolution; a means for detecting the table movement due to heat on the basis of the table-position information; and a servo circuit for controlling the movement. Consequently, there are problems of system complication and increased cost.

Moreover, the stage temperature control as described in Patent Document 2 needs heat-generating components and cooling units. A cooling substance is introduced into a vacuum, and thus the production cost is increased. In addition, when stages are provided as multiple layers, it takes a longer time to perform the temperature control of an upper layer portion.

Furthermore, the active brake as described in Patent Document 3 causes: a complication in the control system; an increase in size of the brake because an actuator such as a piezoelectric element is used; and an increase in cost. Additionally, the position of a stage is shifted when a braking force is applied; accordingly, the positioning has to be performed again, consuming a time in positioning the stage.

An object of the present invention is to provide a specimen stage which is simple in structure, and which suppresses a positional shift due to a friction heat caused by a brake or the like.

An aspect to achieve the above object provides a specimen stage including: a thrust portion thrust by a thrusting member; and a slide surface thrust by the thrust portion. When the specimen stage stops, the specimen stage performs a control in a way that at least one of a part of the slide surface in contact with the thrust portion, a portion adjacent to the part and the thrust portion is heated. By heating the part of the slide surface or the like in this manner, a temperature gradient as described above can be suppressed.

With the above structure, it becomes possible to reduce the stage movement due to the thermal expansion and the thermal contraction of the slide surface.

DESCRIPTION OF SYMBOLS

1 ... stage mechanism, 2 ... stage-position detector, 3 ... stage-position controller, 4 ... heat controller, 6 ... temperature measure, 7 ... thermal-displacement analysis system, 100 ... base, 110 ... X table, 111 ... X guide, 112 ... driving mechanism X, 120 ... Y table, 121 ... Y guide, 122 ... driving mechanism Y, 130 ... specimen holder, 131 ... mirror X, 132 ... mirror Y, 140 ... braking mechanism, 141 ... spring, 142 ... brake pad, 150 ... surface member, 151 ... indium, 160 ... heat-generating body, 161 ... heat insulating sheet

DETAILED DESCRIPTION OF THE PREFERRED EMBODIMENTS

Hereinafter, description will be given, with reference to the drawings, of an aspect of a specimen stage including: a table which moves along a guiding mechanism, and which is equipped with a friction brake that generates friction by a constant spring force; and a surface member provided as a sliding surface with the friction brake. Heat-generating bodies are mounted on the surface member so that a heat-generating position can be changed at pitches in accordance with a stage-utilizing method. In addition, as a stage-positioning control means, provided are a means for detecting the position of a stage, a means for calculating a movement distance to a movement targeted position, and a control means for causing the heat-generating bodies to generate heat in the vicinity of the movement targeted position.

When the stage moves, the heat-generating bodies generate heat in the vicinity of the stage-movement targeted position, and the stage position is set as a reference position where thermal expansion and thermal contraction occur. Thereby, a stage movement due to heat is reduced.

Moreover, in one mode of the present invention, the stage includes: a surface member on which the heat-generating bodies are mounted; and an ultrasonic motor. In another mode, the stage includes: a surface member on which the heat-generating bodies and a friction portion on the sliding-friction stage are mounted.

Furthermore, in an alternative mode, a means for performing a heat control is provided. The means has a function to constantly monitor the temperature of the surface member. When the stage moves, the means performs a thermal analysis simulation on the basis of the temperature of the surface member, the binding condition of the surface member, the stage movement distance, and the brake force value. The means calculates the optimum heat generation amount and the optimum heat generation position. Thereby, a stage movement due to heat is reduced.

With the above structures, it becomes possible to reduce a stage movement due to the thermal expansion and the thermal contraction of the surface member caused by a stage movement.

First Embodiment

Figure 1:
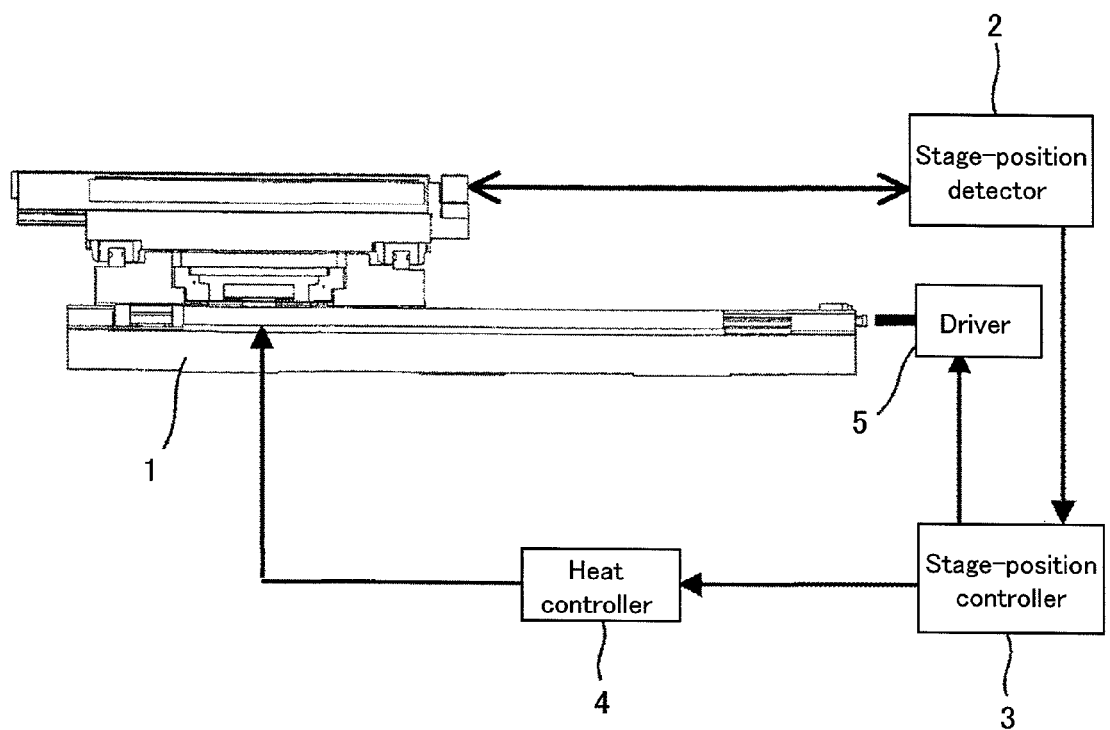
FIG. 1 is a schematic diagram of a stage unit.

FIG. 1 is a schematic diagram of a stage unit. The stage unit includes a stage mechanism 1, a stage-position detector 2, a stage-position controller 3, a heat controller 4 and a stage driver 5. Additionally, the stage unit is surrounded by an unillustrated vacuum chamber, and the vacuum chamber is connected to a mirror body of a charged-particle beam apparatus exemplified by an electron microscope. The charged-particle beam apparatus is connected to an unillustrated control device, and the stage-position controller and the like to be described later are controlled by a command initiated from the control device.

Figure 2:
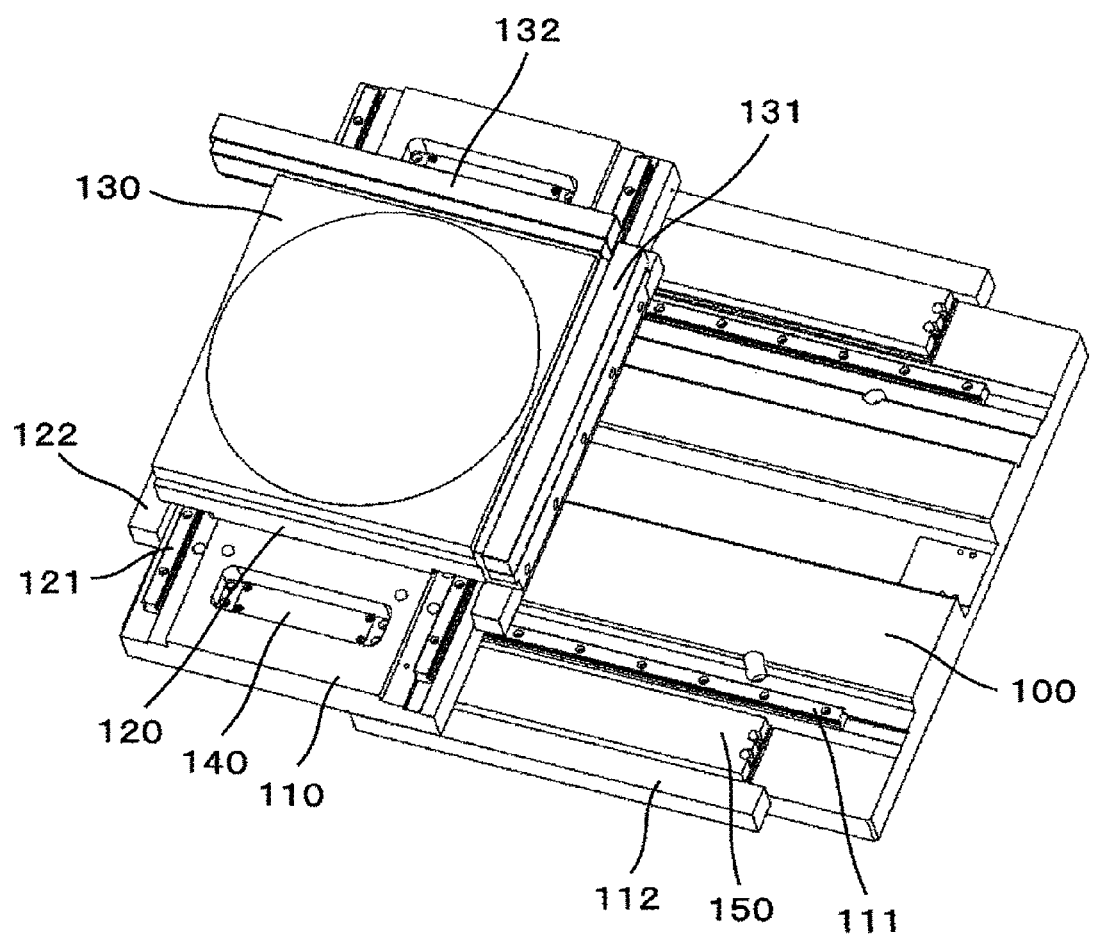
FIG. 2 is a perspective view of a stage mechanism of an embodiment.

FIG. 2 is a perspective view of the stage mechanism. The stage mechanism 1 includes: an X table 110 capable of moving on a base 100 in an X direction; a Y table 120 capable of moving on the X table in a Y direction; a specimen holder 130 placed on an upper portion of the Y table; and an X mirror 131 and a Y mirror 132 for measurement by the stage-position detector 2. The X table 110 is capable of moving in the X direction by an X guide 111 and a driving mechanism X 112 which are guiding mechanisms for the X direction movement. Similarly, the Y table 120 is capable of moving in the Y direction by a Y guide 121 and a driving mechanism Y 122. A braking mechanism 140 is mounted to the X table 110 and the Y table 120. A surface member 150 is placed on the base 100 and the X table 110, and maintains the stage positions in the X and Y directions by the friction force between the surface member 150 and the braking mechanism 140.

Figure 3:
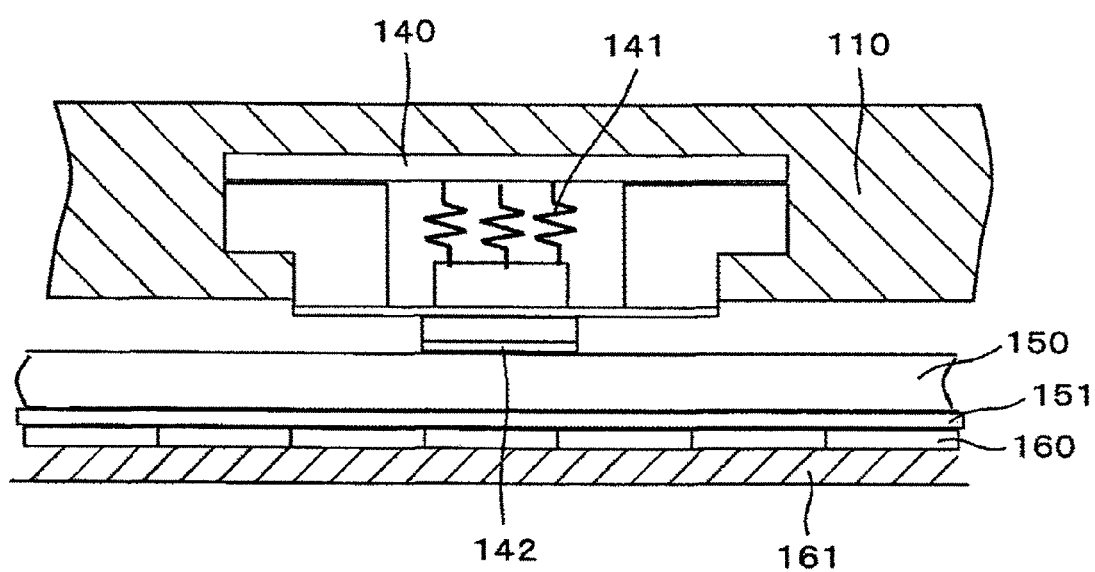
FIG. 3 is a detail view of a stop mechanism portion of the stage.

FIG. 3 is a detail view of the braking mechanism 140 and the surface member 150 which constitute a stop mechanism of the specimen stage.

The braking mechanism 140 is designed as a constant friction brake that generates friction with a brake pad 142 which is thrust by a constant thrust from a spring 141. The spring is a thrusting member, and the brake pad corresponds to a thrust portion. Incidentally, the thrusting member is not limited to a spring and may be, for example, an air damper, as long as such a thrusting member can generate a constant thrust force.

On the bottom surface of the surface member 150 that is one form of a slide surface, a metal having a high thermal conductivity, for example, indium 151 is introduced. Heat-generating bodies 160 whose heat-generating positions are controllable are placed below the indium 151, each of the heat-generating bodies 160 having a width of 10 mm. A heat insulating sheet 161 is introduced below the heat-generating bodies 160. The heat insulating sheet 161 efficiently conducts an amount of heat generated by the heat-generating bodies to the surface member. With regard to the width of an area mounted with the heat-generating bodies, the following problems can be considered: decreased ease of maintenance when the number of heat-generating bodies is large; a reduction in the degree of vacuum due to a gas generated from a wiring portion; and the like. Thus, the width of the area mounted with the mounted heat-generating bodies is preferably changed, depending on: a main stage-moving method; a specimen to be observed; a condition of the degree of vacuum; and the like. Meanwhile, in a stage using an ultrasonic motor, a friction-driver represented by an ultrasonic motor is placed at a position where a braking mechanism 140 is mounted; accordingly, the same heat control is accomplished.

When the stage moves, whether to perform heat control is determined on the basis of the stage movement distance. This is to prevent the thermal expansion and the thermal contraction of a specimen itself by extra heat generation. The threshold value of the movement distance varies, depending on a brake force and the material and shape of the surface member. Thus, the threshold value is determined by actually observing a specimen to check the distance of image drifting.

When the movement distance exceeds the threshold value, the heat control is performed so that the heat-generating bodies in the vicinity of a target position on the stage 160 may generate heat. The heat amount is calculated from the stage movement distance and brake force. The heat of this amount is applied to the surface member until the measurement is completed. When the target position is located between two of the heat-generating bodies 160, both of the heat-generating bodies are caused to generate heat.

As described above, heating members such as the heat-generating bodies 160 are arranged along the movement direction, and, when the table stops, the brake pad 142 causes a part of the surface member 150 to be selectively heated, the part being in contact with the brake pad 142. Thereby, the temperature gradient on the surface member 150 can be suppressed effectively by minimum heating. Furthermore, the fact that the temperature gradient is caused by the friction leads to an assumption that, in the stage moving process, a temperature gradient is caused on the basis of a difference between a temperature at a position which is not in contact with the brake pad 142 and a temperature at a position which is in contact therewith. If a problem of such a temperature gradient arises, the suppression of the temperature gradient can be accomplished by causing the heat-generating body 160 for heating the position which is in contact with the brake pad 142 to heat the adjacent heat-generating body 160.

Note that, in the above example, the description has been given of the case where the heat treatment is performed when the distance exceeds the threshold value. Alternatively, as another form, the heat generation amount may be controlled, depending on the movement distance. In this case, as the movement distance increases, the temperature gradient caused by a friction heat is presumably increased. Thus, as the movement distance increases, the heat generation amount is presumably increased.

Figure 4:
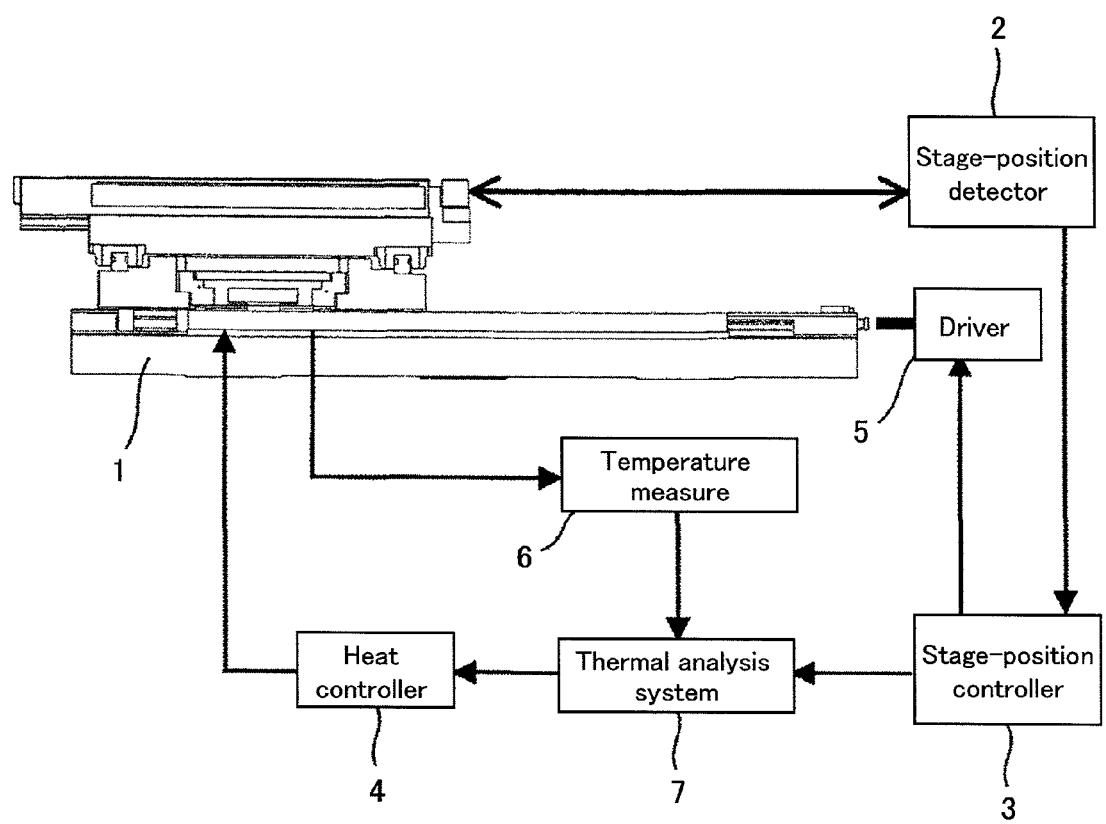
FIG. 4 is a schematic diagram of the stage unit including an analysis system.
Figure 5:
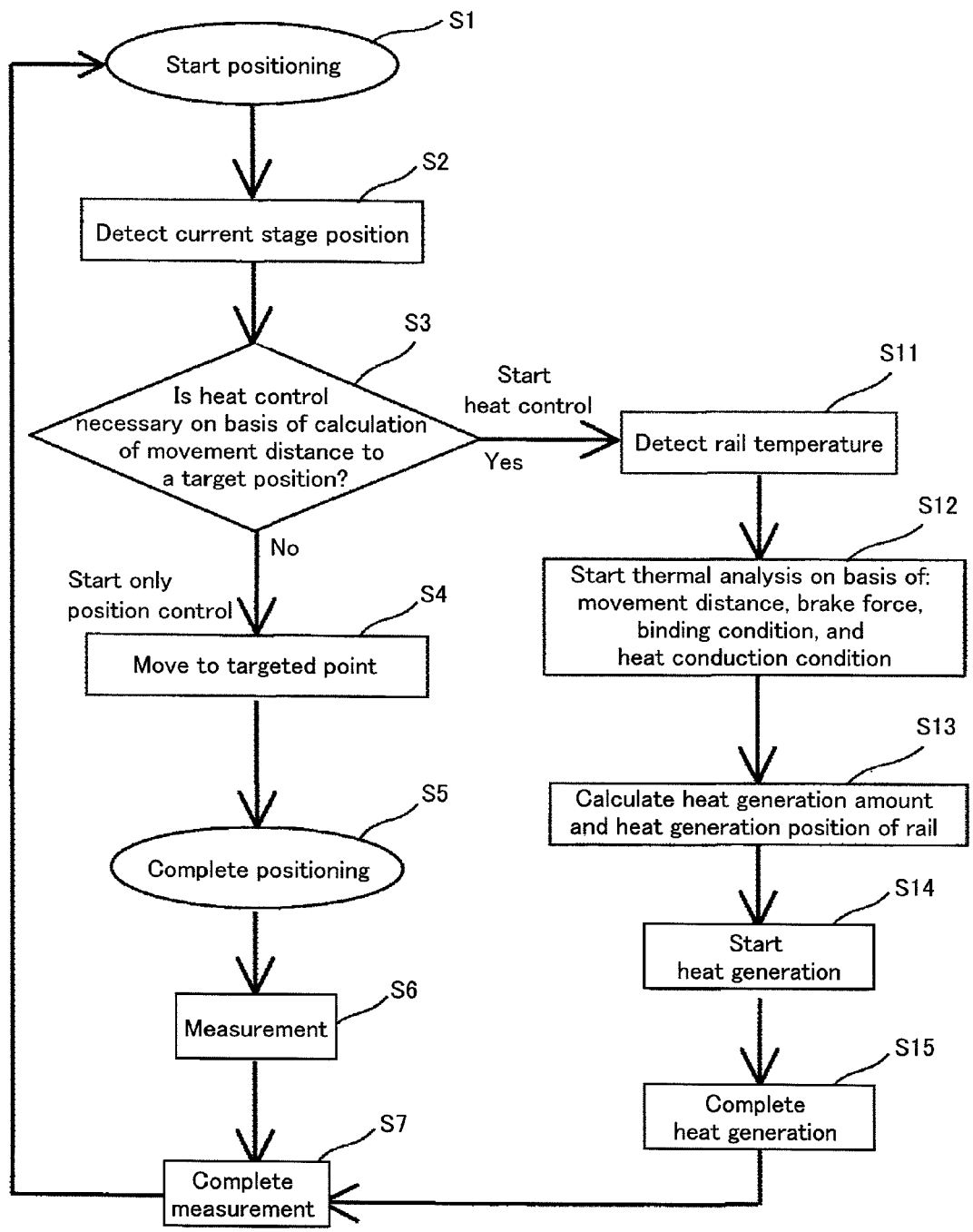
FIG. 5 is a flowchart for illustrating a positioning control in the stage unit utilizing the analysis system.

When there is a need to further reduce image drifting due to heat, a temperature measure 6 and a thermal analysis system 7 are introduced as shown in FIG. 4, and the optimum heat generation position and heat generation amount of the heat-generating bodies 160 can be calculated. This thermal analysis system is one effective means for suppressing the increase in temperature of the stage mechanism as small as possible. FIG. 5 is a flowchart for illustrating a stage positioning control method and a heat control method when the thermal analysis system is introduced. The flow of stage position control and heat control will be described with reference to FIG. 4 and FIG. 5.

First, in Step S1, an instruction to start positioning is issued.

Then, in Step S2, a current stage position is read from the stage-position detector 2. In Step S3, the stage-position controller 3 calculates the movement distance to a target position and judges whether or not a heat control is necessary.

When the heat control is not necessary, the processing proceeds only to Step $S_4$, and the stage-position controller 3 transmits a stage-move signal to the driver.

Subsequently, in Step S5, the stage positioning is completed. In Step S6, a specimen is measured. In Step S7, the measurement is completed.

When the heat control is necessary, the processing proceeds to both Step S4 and Step S11. In Step S11, the temperature of the surface member 150 is monitored by the temperature measure 6. The monitoring is desirably performed at 5 positions or more. Thereafter, in Step S12, a thermal analysis is performed on the basis of: the movement distance calculated by the stage-position controller 3 in Step S3, the temperature data from the temperature measure, the binding condition of the surface member and the brake force. In Step S13, the optimum heat generation amount and generation position are calculated.

Then, in Step 14, the heat controller causes heat-generating bodies 160 to generate the calculated amount of heat. Step S14 is performed after the positioning is completed. After that, as the measurement is completed, Step S15 is simultaneously started, and the heat generation is completed.

Embodiment 2

Figure 6:
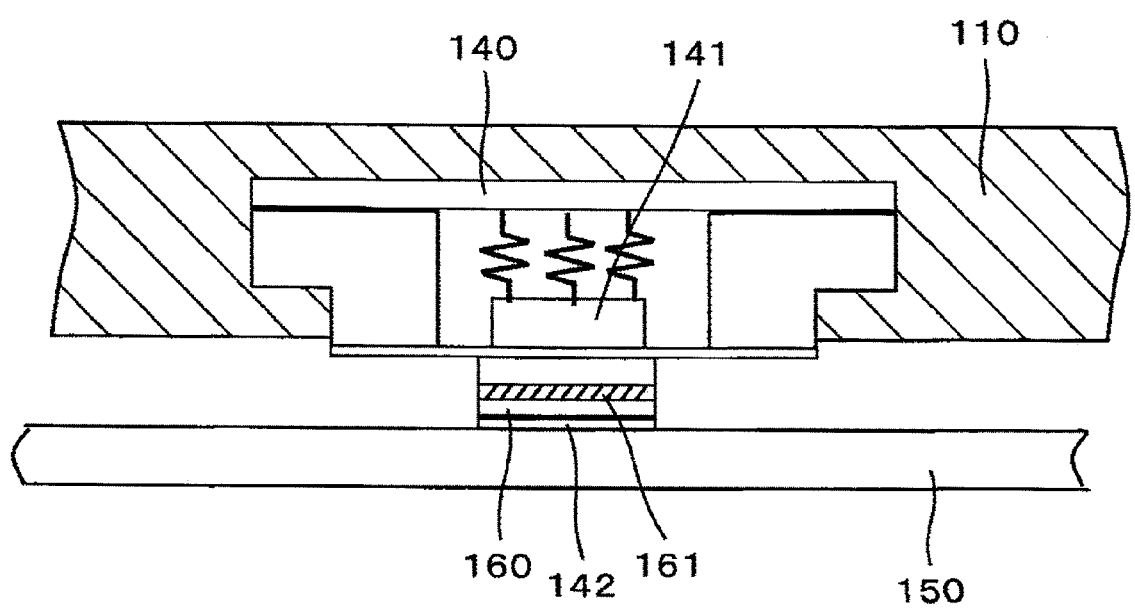
FIG. 6 is a detail view of a stop mechanism portion of a stage with a heat generating component being mounted on a braking mechanism.

FIG. 6 shows a braking mechanism 140 into which a heat-generating body is inserted. A heat-generating body 160 is inserted into the upper surface of a brake pad 142 of the braking mechanism 140. When the brake pad 142 and the heat-generating body 160 adheres to each other, an attention should be paid not to include air bubbles therebetween in order to efficiently conduct an amount of heat generated by the heat-generating body 160. A heat insulating sheet 161 is introduced into an upper layer of the heat-generating body 160 to efficiently conduct the heat to a surface member. With regard to the flow of the heat control, Steps S11, S12, and S13 of FIG. 5 are altered. In Step S11, the temperature of the brake pad 142 is detected. Then, in Step S12, a thermal analysis is performed on the basis of: the temperature of the brake pad 142, the movement distance, the brake force, the binding condition, and the heat conduction condition. Thereafter, in Step S13, a heat generation amount is calculated. Step S14 and the subsequent steps are the same as above.

With the above means, a positional shift of a stage due to heat generated at a stop mechanism portion of the stage can be reduced at the time of observation with an electron microscope.

What is claimed is:

1. A specimen stage comprising:
   a table which moves a sample in a predetermined direction;
   a driving mechanism which moves the table in the predetermined direction;
   a thrust portion connected to the table with a thrusting member therebetween;
   a slide surface on which the thrust portion is thrust by a thrust force of the thrusting member; and
   a heating member which heats each of a plurality of portions located on the slide surface along the predetermined direction,
   wherein the heating member is controlled such that, when the table stops moving, the heating member heats a part of the slide surface in contact with the thrust portion.

2. The specimen stage according to claim 1, wherein a plurality of the heating members are arranged along the predetermined direction.

3. The specimen stage according to claim 2, wherein the heating member is arranged below the slide surface.

4. The specimen stage according to claim 1, further comprising:
   a stage-position controller which controls the driving mechanism, wherein
   when a distance of the table moved by the stage-position controller exceeds a predetermined threshold value or in accordance with the movement distance, the heating is performed on the part of the slide surface in contact with the thrust portion.

5. The specimen stage according to claim 1, wherein a plurality of the tables are stacked to allow the specimen to be moved in X-Y directions.

6. A specimen stage comprising:
   a table which moves a sample in a predetermined direction;
   a driving mechanism which moves the table in the predetermined direction;
   a thrust portion connected to the table with a thrusting member therebetween;
   a slide surface on which the thrust portion is thrust by a thrust force of the thrusting member; and
   a heating member which heats each of a plurality of portions located on the slide surface along the predetermined direction,
   wherein the heating member is controlled such that, when the table stops moving, the heating member heats the thrust portion.

7. The specimen stage according to claim 6, wherein a plurality of the tables are stacked to allow the specimen to be moved in X-Y directions.

* * * * *